(12) United States Patent
Lin et al.

(10) Patent No.: US 7,446,407 B2
(45) Date of Patent: Nov. 4, 2008

(54) CHIP PACKAGE STRUCTURE

(75) Inventors: Chun-Hung Lin, Tainan County (TW); Geng-Shin Shen, Tainan County (TW)

(73) Assignees: ChipMOS Technologies Inc., Hsinchu (TW); ChipMOS Technologies (Bermuda) Ltd., Hamiltom (BM)

( * ) Notice: Subject to any disclaimer, the term of this patent is extended or adjusted under 35 U.S.C. 154(b) by 0 days.

(21) Appl. No.: 11/217,978

(22) Filed: Aug. 31, 2005

(65) Prior Publication Data

US 2007/0045835 A1 Mar. 1, 2007

(51) Int. Cl.
*H01L 23/12* (2006.01)
*H01L 23/34* (2006.01)
*H01L 23/10* (2006.01)
*H01L 23/31* (2006.01)
*H01L 21/50* (2006.01)
*H01L 21/48* (2006.01)
*H01L 21/44* (2006.01)

(52) U.S. Cl. .............. 257/704; 257/706; 257/707; 257/718; 257/719; 257/720; 257/E23.128; 257/E23.193; 438/121; 438/122

(58) Field of Classification Search ................. 257/712, 257/704, 706, 707, 718, 719, 720, E23.128, 257/E23.193; 438/121, 122
See application file for complete search history.

(56) References Cited

U.S. PATENT DOCUMENTS 5,208,188 A * 5/1993 Newman .................... 156/310
5,560,795 A * 10/1996 Bruckner et al. ............. 156/182
5,909,058 A * 6/1999 Yano et al. .................. 257/712
6,020,637 A * 2/2000 Karnezos .................... 257/738
6,114,755 A * 9/2000 Ito et al. ..................... 257/675
6,190,943 B1 2/2001 Lee et al. .................... 438/107
6,215,180 B1 * 4/2001 Chen et al. .................. 257/720
6,258,631 B1 * 7/2001 Ito et al. ..................... 438/123
6,281,578 B1 * 8/2001 Lo et al. ..................... 257/724
6,426,875 B1 * 7/2002 Akram et al. ................ 361/704
6,544,864 B2 * 4/2003 Reeder et al. ............... 438/455
6,917,107 B2 * 7/2005 Akram ....................... 257/738
6,979,598 B2 * 12/2005 Jiang et al. .................. 438/118
7,025,848 B2 * 4/2006 Wang ......................... 156/256
2002/0050585 A1 * 5/2002 Masayuki et al. ........... 252/500
2003/0040142 A1 * 2/2003 Lin et al. .................... 438/118
2006/0275952 A1 * 12/2006 Gowda et al. ............... 438/122

* cited by examiner

*Primary Examiner*—Luan Thai
(74) *Attorney, Agent, or Firm*—J.C. Patents

(57) ABSTRACT

A chip package structure includes a substrate, a chip, a first B-stage adhesive, bonding wires, a heat sink and a molding compound. The substrate comprises a first surface, a second surface and a through hole. The chip is arranged on the first surface of the substrate and electrically connected thereto while the through hole of the substrate exposes a portion of the chip. The first B-stage adhesive is arranged between the chip and the first surface of the substrate, and the chip is attached to the substrate through the first B-stage adhesive. The bonding wires are connected between the chip exposed by the through hole and second surface of the substrate. The heat sink is arranged on the first surface of the substrate, covering the chip. The molding compound is arranged on the second surface of the substrate, covering a portion of the substrate and bonding wires.

13 Claims, 6 Drawing Sheets

CHIP PACKAGE STRUCTURE

BACKGROUND OF THE INVENTION

1. Field of the Invention

The present invention generally relates to a semiconductor package structure. More particularly, the present invention relates to a substrate on chip (SOC) package structure.

2. Description of Related Art

The so-called "SOC (Substrate-On-Chip) packaging" refers to a common semiconductor packaging structure. In such structure, semiconductor chips are attached on a substrate with holes, and a plurality of metal bonding wires connect the substrate with the chips via the holes. Normally the substrate is also formed with a plurality of solder balls in a grid array. In the U.S. Pat. No. 6,190,943 entitled "CHIP SCALE PACKAGING METHOD", a chip scale package structure and a packaging method are disclosed. As shown in FIG. 1, the chip scale package 20 comprises a wiring substrate 22, a semiconductor chip 24, and a plurality of spherical bonding balls 44. The substrate 22 has an upper surface 30 for attaching the chip 24 and an underside 38 with the spherical bonding balls 44 implanted therein, and through holes 34 passing through the upper surface 30 and the underside 38. The chip 24 is attached to the upper surface 30 of the substrate 22 by a thermoplastic adhesive layer 28. The through holes 34 of substrate 22 expose the bonding pads 36 of the active surface 26 on chip 24 so that the bonding wires 32 may connect the bonding pads 36 of the chip 24 and the conductive area 41 of substrate 22 via the through holes 34. The conductive area 41 is provided with a conductive layer 40 formed on the underside 38 of substrate 22. The fringe of the chip 24, and each of the through holes 34 of substrate 22 are protected by a passivation layer 42 of a non-conducting resin material.

As shown in FIG. 2, the method for making the chip scale package structure 20 disclosed in the U.S. Pat. No. 6,190,943 entitled "CHIP SCALE PACKAGING METHOD" comprises the steps of: (a) providing a substrate 22 with an upper surface 30 which is provided with at least one chip-implanting area 302 including the through holes 34 mentioned above; (b) coating a thermoplastic adhesive layer 28 on the chip-implanting areas 302 by stenciling; (c) implanting chips 24 in the area 302 such that the active surfaces 26 are in contact with the thermoplastic adhesive layer 28, and that the bonding pads 36 are corresponding in location to the through holes 34; (d) heating the substrate 22 and the chips 24 under pressure for a predetermined period of time; (e) forming the bonding wires 32 connecting the conductive area 41 of the substrate 22 with the bonding pads 36 of the chips 24 by wire-bonding via the through holes 34; (f) providing a passivation layer 42 on the fringe of the chip 24 and the through holes 34; and (g) implanting a plurality of bonding balls 44 in a grid array on the underside 38 of the substrate 22. The chip scale package structure 20 is therefore formed by following the above-mentioned steps.

However, the chip scale package structure 20 has the following disadvantages:

1. The thermoplastic adhesive layer 28 mentioned in step (b) is an elastic, semi-liquid, solvent-free thermoplastic silicon rubber. Because it is semi-liquid before attachment, during the heating and pressuring process, the thermoplastic adhesive layer 28 in step (d) is easy to overflow and thus cover the bonding pads 36 of the chip 24, causing packaging failure.
2. After the thermoplastic adhesive layer 28 is coated in step (b), the substrates 22 cannot be piled up for delivery or storage. The thermoplastic adhesive layer 28 must be attached to the chips 24 as soon as possible, otherwise, the substrates 22 will be contaminated and adhere to each other, causing difficulties in the manufacture process.
3. With the increase of the operation frequency of the chip 24, the heat generated from the chip 24 also increases, such that the heat dissipation of the chip scale package structure 20 becomes more and more important.

SUMMARY OF THE INVENTION

A main purpose of the present invention is to provide a chip package structure, utilizing a B-stage adhesive for attaching a chip to a substrate. Therefore, the overflowing thermoplastic adhesive layer in a conventional chip scale package can be avoided, such that the manufacture quality of the chip package structure can be improved.

A second purpose of the present invention is to provide a chip package structure, utilizing a heat sink attached to a chip via a B-stage adhesive for heat dissipation.

As embodied and broadly described herein, the present invention provides a chip package structure comprising a substrate, a chip, a first B-stage adhesive, a plurality of bonding wires, a heat sink and a molding compound. The substrate comprises a first surface, a second surface and a through hole. The chip is arranged on the first surface of the substrate and electrically connected thereto while the through hole of the substrate exposes a portion of the chip. The first B-stage adhesive is arranged between the chip and the first surface of the substrate, and the chip is attached to the substrate through the first B-stage adhesive. The bonding wires are connected between the chip exposed by the through hole and the second surface of the substrate. The heat sink is arranged on the first surface of the substrate and covers the chip. The molding compound is arranged on the second surface of the substrate and covers a portion of the substrate and the bonding wires.

According to an embodiment of the present invention, the glass transition temperature of the first B-stage adhesive is between about −40° C. and 175° C.

According to an embodiment of the present invention, the chip package structure further comprises a heat dissipation adhesive layer arranged between the substrate and the heat sink. The heat dissipation adhesive layer can be a thermal paste, a film or a second B-stage adhesive while the glass transition temperature of the second B-stage adhesive is between about −40° C. and 175° C.

According to an embodiment of the present invention, the chip package structure further comprises a seal resin arranged between the circumference of the chip and the first B-stage adhesive layer.

According to an embodiment of the present invention, the heat sink comprises a top plate and a supporting part connected thereto. The top plate covers the chip and the supporting part is in contact with the substrate.

According to an embodiment of the present invention, the supporting part is perpendicular to the substrate.

According to an embodiment of the present invention, an acute angle is formed between the supporting part and the substrate.

According to an embodiment of the present invention, the chip package structure further comprises a seal resin arranged between the circumference of the supporting part and the substrate.

According to an embodiment of the present invention, the chip comprises a plurality of bonding pads. The through hole exposes the bonding pads, and the bonding wires are electrically connected between the bonding pads and the second surface of the substrate.

According to an embodiment of the present invention, the chip package structure further comprises a plurality of solder balls arranged on the second surface of the substrate.

As embodied and broadly described herein, the present invention also provides a chip package structure comprising a heat sink, a chip and a adhesive layer. The chip is arranged under the heat sink. The adhesive layer can be a thermal paste, a film or a B-stage adhesive. The glass transition temperature of the B-stage adhesive is between about –40° C. and 175° C.

The B-stage adhesive is arranged between the chip and the heat sink while the chip is attached to the heat sink through the B-stage adhesive.

According to an embodiment of the present invention, the glass transition temperature of the B-stage adhesive is between about –40° C. and 175° C.

According to an embodiment of the present invention, the heat sink comprises a top plate and a supporting part connected thereto. The chip is arranged under the top plate.

According to an embodiment of the present invention, the supporting part is perpendicular to the substrate.

According to an embodiment of the present invention, an acute angle is formed between the supporting part and the substrate.

In summary, the chip package structure of the present invention utilizes the B-stage adhesive arranged on one surface of the substrate for chip-attachment. Because the B-stage adhesive takes the form of a gel, the bonding pads of the chip are not covered by the B-stage adhesive. Therefore, the yield rate of the chip package structure can be improved. Besides, the invention makes use of a heat sink arranged on one side of the chip for conducting the heat generated from the chip, and a heat dissipation adhesive layer arranged between the heat sink and the chip for fixing the heat sink on the chip and facilitating heat dissipation.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
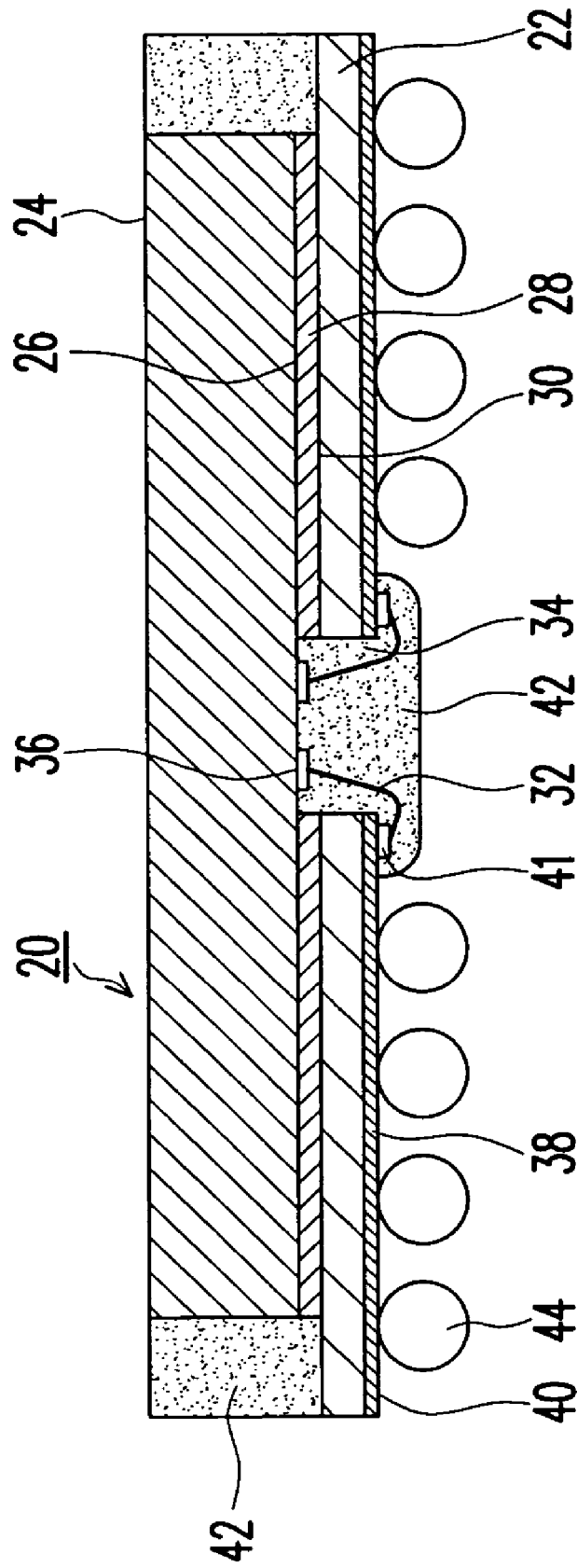
FIG. 1 is a sectional view of a chip scale package structure according to U.S. Pat. No. 6,190,943 entitled "CHIP SCALE PACKAGING METHOD".
Figure 2:
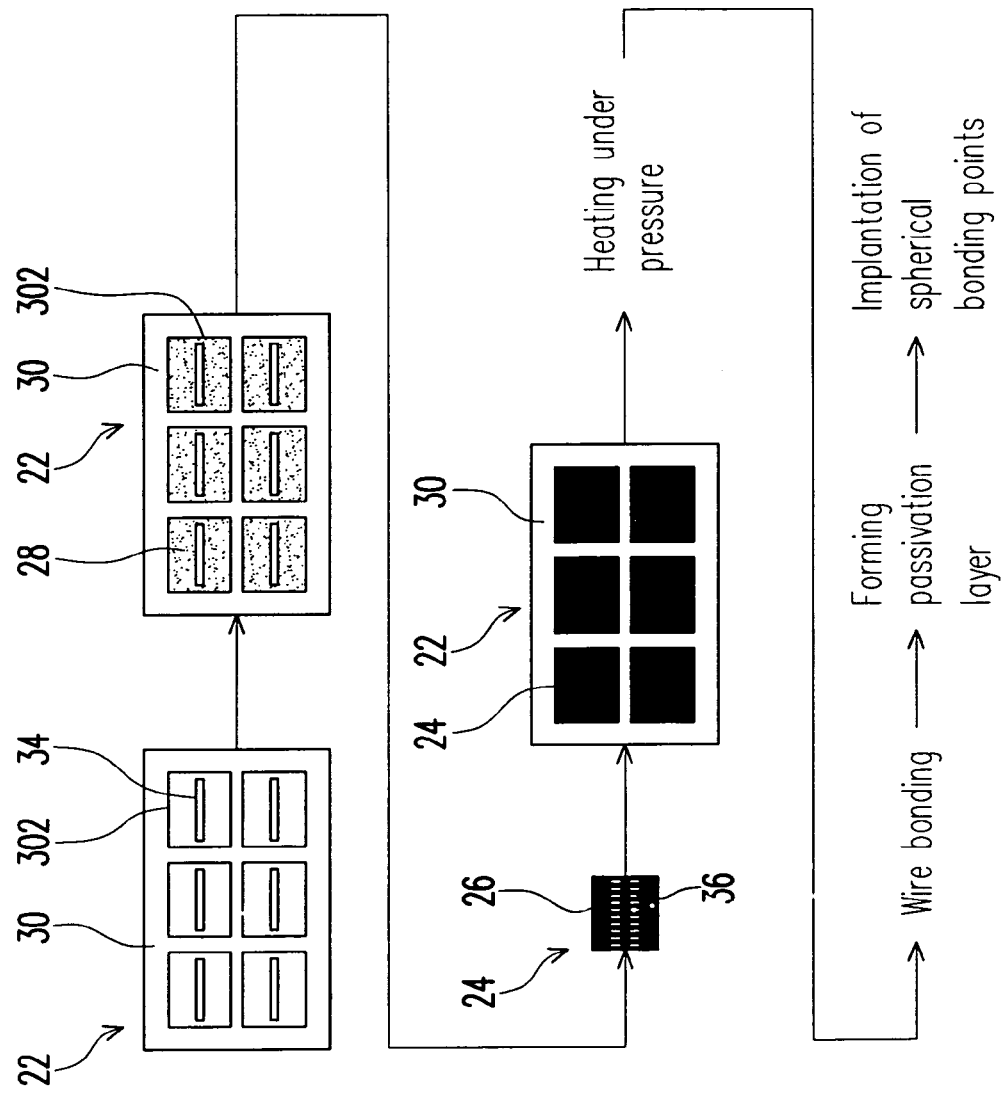
FIG. 2 is a flowchart for making the chip scale package structure in accordance with U.S. Pat. No. 6,190,943 entitled "CHIP SCALE PACKAGING METHOD".

Reference will now be made in detail to the present embodiments of the invention, examples of which are illustrated in the accompanying drawings. Wherever possible, the same reference numbers are used in the drawings and the description to refer to the same or like parts.

Figure 3:
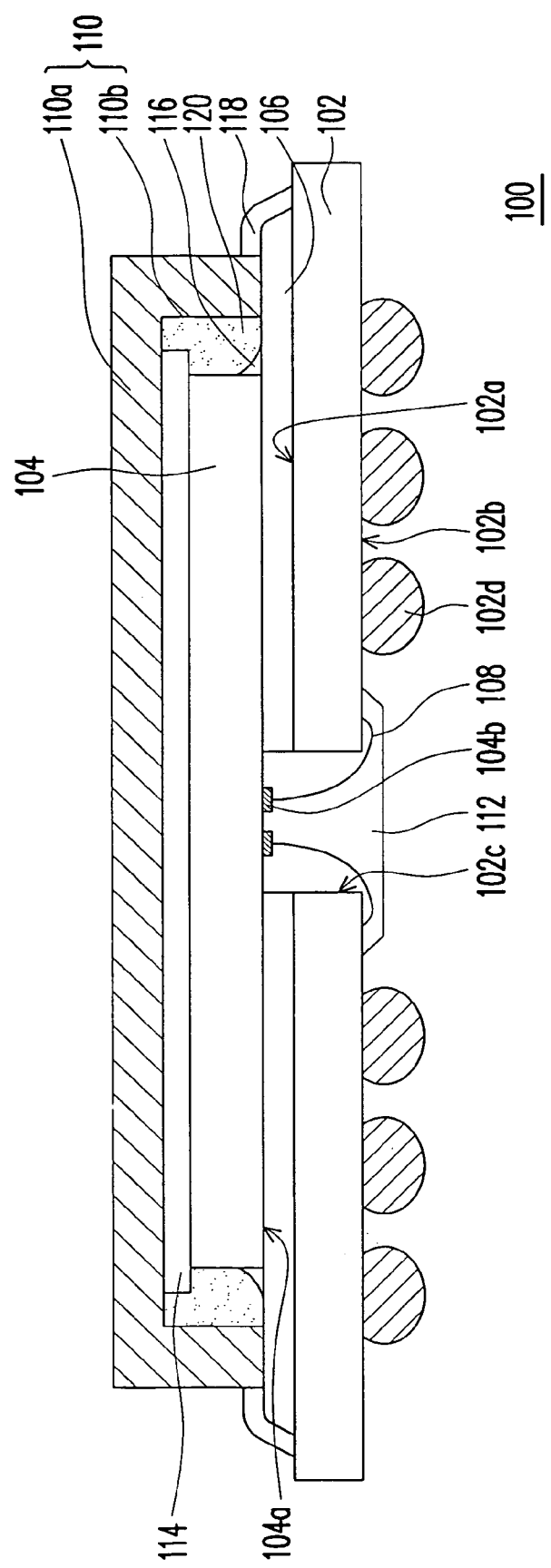
FIG. 3 is a sectional view of a chip package structure according to a first embodiment of the present invention

FIG. 3 is a sectional view of a chip package structure according to a first embodiment of the present invention. Please refer to FIG. 3. The chip package structure 100 mainly comprises a substrate 102, a chip 104, a first B-stage adhesive 106, a plurality of bonding wires 108, a heat sink 110, a heat dissipation adhesive layer 114, and a molding compound 112. The substrate 102 comprises a first surface 102a, a second surface 102b and a through hole 102c. The second surface 102b is opposite to the first surface 102a while the through hole 102c connects the first surface 102a and the second surface 102b. In this embodiment, the substrate 102 is a printed circuit board such as FR-4, FR-5, BT and the like. The second surface 102b of the substrate 102 is formed with a circuit pattern (not shown) and solder balls 102d. The chip package structure 100 is electrically connected to other electronic devices (not shown) through the solder balls 102d. The chip 104 is arranged on the first surface 102a of the substrate 102 while its active surface 104a faces the first surface 102a of the substrate 102. The active surface 104a of the chip 104 has integrated circuits (not shown) and bonding pads 104b formed thereon while the bonding pads 104b are corresponding in location to the through hole 102c of the substrate 102. The first B-stage adhesive 106 is arranged between the chip 104 and the first surface 102a of the substrate 102, and the chip 104 is attached to the substrate 102 by the first B-stage adhesive 106. In this embodiment, the first B-stage adhesive 106 and the chip 104 arranged on the substrate 102 are formed by the following steps. First, a layer of "two-stage thermosetting mixture" is coated on the first surface 102a of the substrate 102. The thermosetting mixture includes a material selected from polyimide, polyquinolin, benzocyclobutene, and the like. The two-stage thermosetting mixture has the A-stage characteristic while coating on the substrate 102. During the coating process, the thermosetting mixture is in liquid or gel state and so it is easy to spread on the first surface 102a of the substrate 102. Therefore the thermosetting mixture could be formed on the first surface 102a of the substrate 102 not only by stenciling, but also by painting, printing, spraying, spin-coating, or dipping. Thereafter, the substrate 102 is pre-cured by heating the thermosetting mixture or using UV light to expose the thermosetting mixture, and then the thermosetting mixture becomes a dry adhesive film. At this time, the dry adhesive film disposed on the substrate 102 is the first B-stage adhesive 106 having the B-stage characteristic. Preferably, the first B-stage adhesive 106 has a glass transition temperature (Tg) between about –40° C. and 175° C. After that, the chip 104 is adhered to the first B-stage adhesive 106 while the through hole 102c exposes the bonding pads 104b of the chip 104. Because the first B-stage adhesive 106 takes the form of a gel, the chip 104 adhered thereto is not easy to move and the overflow of the liquid thermoplastic adhesive layer in the prior art can be avoided.

The bonding wires 108 are connected between the bonding pads 104b of the chip 104 and the circuit pattern provided on the second surface 102b of the substrate 102 by a wire-bonding technique via the through hole 102c. Therefore, the chip 104 is electrically connected to the substrate 102 by the bonding wires 108. The heat sink 110 is arranged on the first surface 102a of the substrate 102 and covers the chip 104 for conducting the heat generated from the chip 104 to the outside during operation. In this embodiment, the heat sink 110 is disposed on the first B-stage adhesive 106, and comprises a top plate 110a and a supporting part 110b connected thereto. The top plate 110a covers the chip 104, the supporting part 110b is in contact with the substrate 102, and the supporting part 110b is perpendicular to the substrate 102. The heat sink 110 can be made of metal such as copper and the like for conducting the heat. The molding compound 112 for protecting the bonding wires 108 and the exposed chip 104 is arranged on the second surface 102b of the substrate 102 and covers the bonding wires 108 and a portion of the substrate 102.

The heat dissipation adhesive layer 114 can be a film, a thermal paste generally used for further conducting the heat generated from the chip 104, or a second B-stage adhesive whose coefficient of thermal conductivity can be adjusted to the same as that of the thermal paste for conducting the heat and fixing the heat sink 110 on the chip 104. The second B-stage adhesive also has a glass transition temperature (Tg) between about −40° C. and 175° C. Besides, a seal resin 116 is arranged between the circumference of the chip 104 and the first B-stage adhesive 106 for further fixing the chip 104 on the first B-stage adhesive 106. Besides, a seal resin 118 is optionally arranged between the circumference of the supporting part 110b and the substrate 102 for fixing the heat sink 110 on the substrate 102 Besides, the space formed between the first B-stage adhesive 106, the chip 104 and the heat sink 110 is optionally filled with a thermal paste 120 in order to further conduct the heat generated from the chip 104 during operation.

Figure 4:
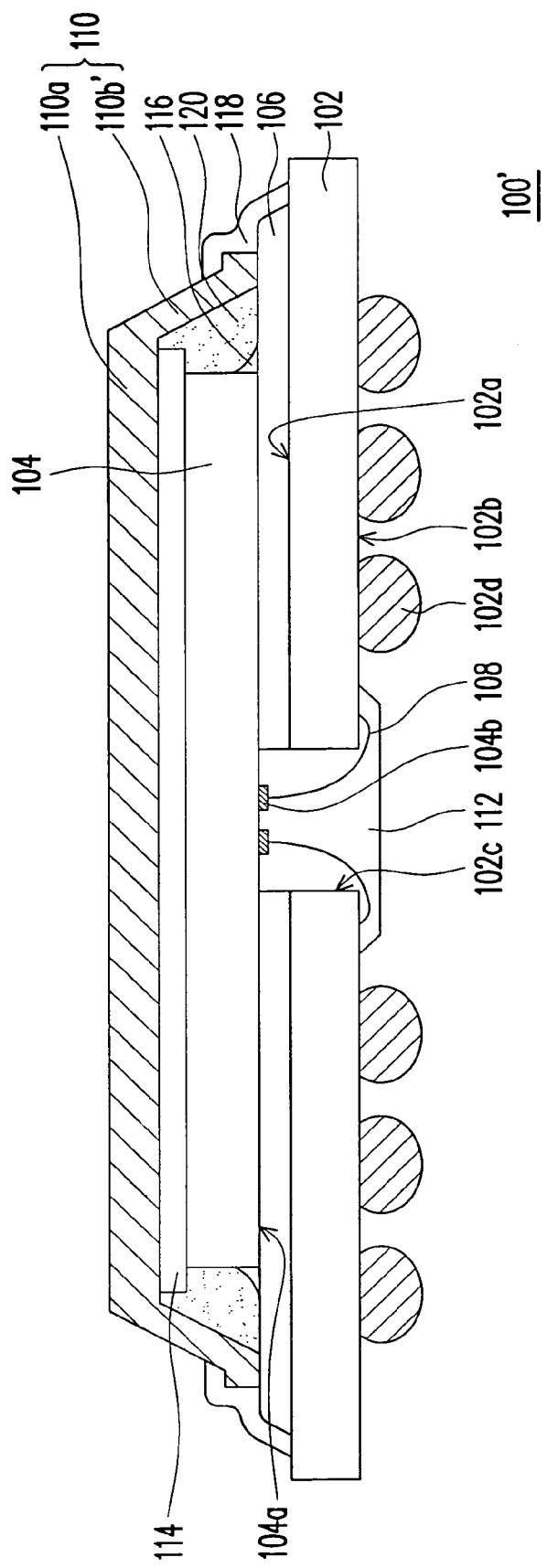
FIG. 4 is a sectional view of a chip package structure according to a second embodiment of the present invention.

FIG. 4 is a sectional view of a chip package structure according to a second embodiment of the present invention. The chip package structure 100' is similar to the chip package structure 100 shown in FIG. 3, and the only difference is that the supporting part 110b' shown in FIG. 4 is inclined, such that an acute angle θ is formed between the supporting part 110b' and the substrate 102. However, the heat sink 110 may have various types and the shape of the heat sink 110 is not limited in the present invention. Similarly, the space formed between the first B-stage adhesive 106, the chip 104 and the heat sink 110 is optionally filled with a thermal paste 120 in order to further conduct the heat generated from the chip 104 during operation.

The method of forming the chip package structures 100 and 100' shown in FIGS. 3~4 is illustrated in the following. When using a B-stage adhesive film as the heat dissipation adhesive layer 114, the B-stage adhesive film is attached to the heat sink 110 first and then the heat sink 110 is attached to the chip 104 through the B-stage adhesive film. Besides, when using a thermal paste as the heat dissipation adhesive layer 114, the thermal paste is coated on the back of the chip 104 and the then the heat sink 110 is attached to the chip 104 through the thermal paste.

Figure 5:
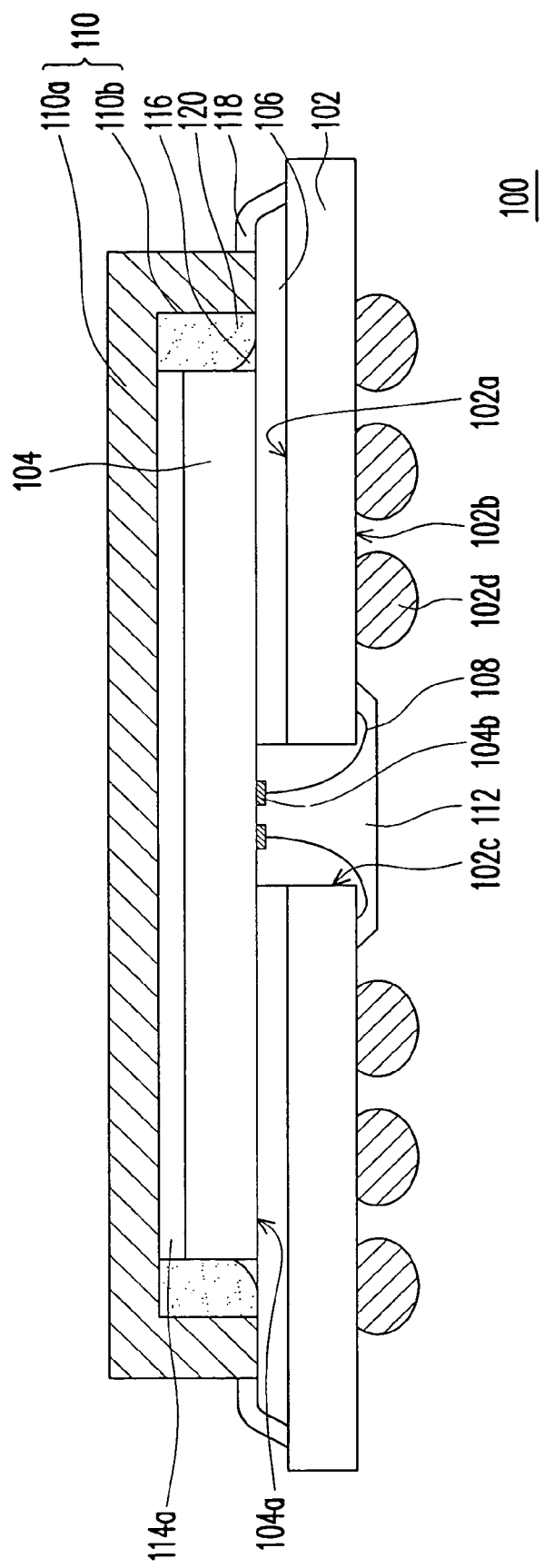
FIG. 5 is a sectional view of a chip package structure according to a third embodiment of the present invention.

FIG. 5 is a sectional view of a chip package structure according to a third embodiment of the present invention. The chip package structure 100" is similar to the chip package structure 100 shown in FIG. 3, and the only difference is that the edge of the heat dissipation adhesive layer 114a formed of the B-stage adhesive or a film is aligned with that of the chip 104. The method of bonding the chip 104 and the heat sink 110 comprises the following steps. First, a thermosetting mixture is coated on the back of a wafer and then a pre-curing process is performed to form the B-stage adhesive. Next, the wafer is divided into a plurality of chips. Therefore, the edge of the B-stage adhesive is aligned with that of the chip 104. Finally, the chip 104 with the B-stage adhesive is attached to the heat sink 110.

Figure 6:
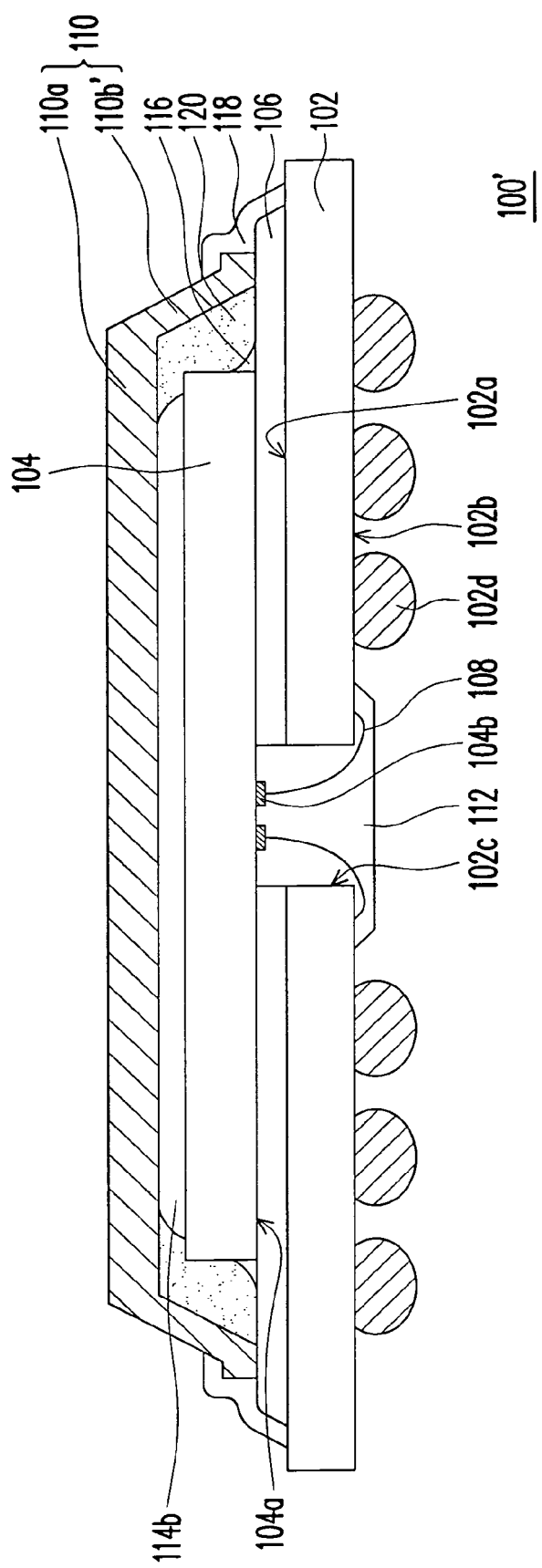
FIG. 6 is a sectional view of a chip package structure according to a fourth embodiment of the present invention.

FIG. 6 is a sectional view of a chip package structure according to a fourth embodiment of the present invention. The chip package structure 100''' is similar to the chip package structure 100 shown in FIG. 3, and the only difference is that, the area of the heat dissipation layer 114b formed of the B-stage adhesive is smaller than that of the chip 104 and the distance between the surface of the heat dissipation layer 114 and the chip 104 is increased from the outside towards the inside. The method of bonding the chip 104 and the heat sink 110 comprises the following steps. A thermosetting mixture is dispensed on the back of the chip 104 and then a pre-curing process is performed to form a B-stage adhesive. The heat sink 110 is attached to the chip 104 through the b-stage adhesive.

The chip package structure of the present invention utilizes the B-stage adhesive for connecting the heat sink and the chip, and the structure can be applied to other types of chip package structure. For example, when manufacturing a chip package structure, a plurality of heat sinks are arranged in a grid array first. Then, a B-stage adhesive is dispensed to each heat sink. Finally, a plurality of chips are arranged on the B-stage adhesive disposed on the heat sink respectively. The chip package structure is completed by the above-mentioned steps and it can be electrically connected to other carriers or electronic devices. Therefore, the types of the substrate and the arrangement of the chip, the B-stage adhesive and the heat sink are not limited in the present invention.

In light of the above, the invention utilizes the B-stage adhesive which is a "two-stage thermosetting mixture" and takes the form of a gel, as the adhesive layer for the chip and the substrate, such that the bonding pads of the chip are not covered by the B-stage adhesive and the yield rate of the chip package structure can be improved. Besides, the invention makes use of a heat sink arranged on one side of the chip for conducting the heat generated from the chip, and a heat dissipation adhesive layer arranged between the heat sink and the chip for fixing the heat sink on the chip and facilitating heat dissipation.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
    a substrate, comprising a first surface, a second surface and a through hole;
    a chip, arranged on the first surface of the substrate and electrically connected thereto, wherein the through hole of the substrate exposes a portion of the chip;
    a first B-stage adhesive, arranged between the chip and the first surface of the substrate, wherein the chip is attached to the substrate through the first B-stage adhesive;
    a plurality of bonding wires, connected between the chip and the second surface of the substrate via the through hole;
    a heat sink, arranged on the first surface of the substrate and covering the chip;
    a molding compound, arranged on the second surface of the substrate and covering the bonding wires and a portion of the substrate; and
    a heat dissipation adhesive layer, arranged between the chip and the heat sink in direct contact and bonding the chip and the heat sink, wherein the heat dissipation adhesive layer is smaller than the chip size and the heat dissipation adhesive layer is a second B-stage adhesive, wherein an area of the heat dissipation adhesive layer from the chip to the heat sink is gradually reducing.

2. The chip package structure according to claim 1, wherein the glass transition temperature of the first B-stage adhesive is between about -40° C. and 175° C.

3. The chip package structure according to claim 1, wherein the heat dissipation adhesive layer is a thermal paste.

4. The chip package structure according to claim 1, wherein the heat dissipation adhesive layer is a film.

5. The chip package structure according to claim 1, wherein the glass transition temperature of the second B-stage adhesive is between about -40° C. and 175° C.

6. The chip package structure according to claim 1, further comprising a seal resin arranged between the circumference of the chip and the first B-stage adhesive.

7. The chip package structure according to claim 1, wherein the heat sink comprises a top plate and a supporting part connected thereto, the top plate covering the chip and the supporting part being in contact with the substrate.

8. The chip package structure according to claim 7, wherein the supporting part is perpendicular to the substrate.

9. The chip package structure according to claim 7, wherein an acute angle is formed between the supporting part and the substrate.

10. The chip package structure according to claim 1, further comprising a seal resin arranged between the circumference of the supporting part and the substrate.

11. The chip package structure according to claim 1, further comprising a plurality of solder balls arranged on the second surface of the substrate.

12. A chip package structure, comprising:
- a heat sink;
- a chip, arranged on the heat sink; and
- a film, arranged between the chip and the heat sink in direct contact, wherein the chip is attached to the heat sink through the film, and an area of the film is smaller than that of the chip, wherein the film layer is a second B-stage adhesive, wherein the area of the film varying from the chip to the heat sink is gradually reducing.

13. The chip package structure according to claim 12, wherein the heat sink comprises a top plate and a supporting part connected thereto, and the chip is arranged under the top plate.

* * * * *